United States Patent
Goto et al.

(10) Patent No.: US 8,810,517 B2
(45) Date of Patent: Aug. 19, 2014

(54) INPUT APPARATUS, INFORMATION PROCESSING APPARATUS, OPERATION INPUT METHOD, AND SENSOR SHEET

(75) Inventors: Tetsuro Goto, Tokyo (JP); Osamu Ito, Tokyo (JP); Shinobu Kuriya, Kanagawa (JP); Toshiyuki Nakagawa, Kanagawa (JP); Tsubasa Tsukahara, Tokyo (JP)

(73) Assignee: Sony Corporation, Tokyo (JP)

(*) Notice: Subject to any disclaimer, the term of this patent is extended or adjusted under 35 U.S.C. 154(b) by 231 days.

(21) Appl. No.: 13/116,152

(22) Filed: May 26, 2011

(65) Prior Publication Data

US 2011/0298699 A1 Dec. 8, 2011

(30) Foreign Application Priority Data

Jun. 3, 2010 (JP) ................................ 2010-127516

(51) Int. Cl.
*G06F 3/02* (2006.01)
(52) U.S. Cl.
USPC ........................... 345/168; 345/184; 345/156
(58) Field of Classification Search
CPC ........................................................ G06F 3/044
See application file for complete search history.

(56) References Cited

U.S. PATENT DOCUMENTS

| | | | | |
|---|---|---|---|---|
| 6,995,326 | B2* | 2/2006 | Sugimura et al. | 200/5 R |
| 2003/0169231 | A1* | 9/2003 | Rekimoto | 345/156 |
| 2004/0243854 | A1* | 12/2004 | Lee | 713/202 |
| 2006/0038789 | A1* | 2/2006 | Ban et al. | 345/169 |
| 2006/0077181 | A1* | 4/2006 | Sato | 345/169 |
| 2006/0255971 | A1* | 11/2006 | Kim | 341/34 |
| 2007/0243933 | A1* | 10/2007 | Cheng | 463/37 |
| 2010/0291973 | A1* | 11/2010 | Nakahara et al. | 455/566 |
| 2011/0107958 | A1* | 5/2011 | Pance et al. | 116/205 |

FOREIGN PATENT DOCUMENTS

| | | |
|---|---|---|
| JP | HEI 09-251350 | 9/1997 |
| JP | 11-194882 | 7/1999 |
| JP | 2002-131149 | 5/2002 |
| JP | 2002-229732 | 8/2002 |
| JP | 2002-358151 | 12/2002 |
| JP | 2004-535712 | 11/2004 |
| JP | 2005-044214 | 2/2005 |
| JP | 2005-063230 | 3/2005 |
| JP | 2008-270000 | 11/2008 |

OTHER PUBLICATIONS

Japanese Patent Office, Office Action issued in connection with Japanese Patent Application No. 2010-127516, dated Jan. 14, 2014. (4 pages).

* cited by examiner

*Primary Examiner* — Lixi C Simpson
(74) *Attorney, Agent, or Firm* — K&L Gates LLP

(57) ABSTRACT

Provided is an input apparatus including an input operation section, a capacitive sensor, and an output section. The input operation section includes an operation member configured to mechanically receive an input operation, and a first detection circuit configured to detect the input operation of the operation member. The capacitive sensor includes a plurality of electrodes which are arranged around the operation member, and each of which has a capacitance variable due to an approaching of a detection target, and a second detection circuit configured to detect the capacitance of each of the plurality of electrodes. The output section is configured to output an output of the first detection circuit and an output of the second detection circuit.

12 Claims, 9 Drawing Sheets

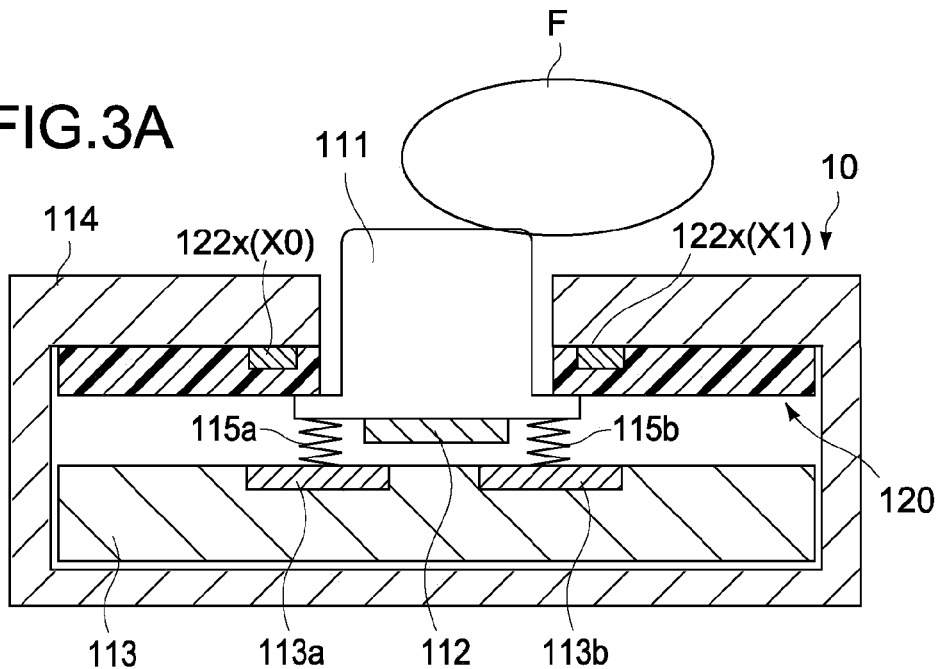
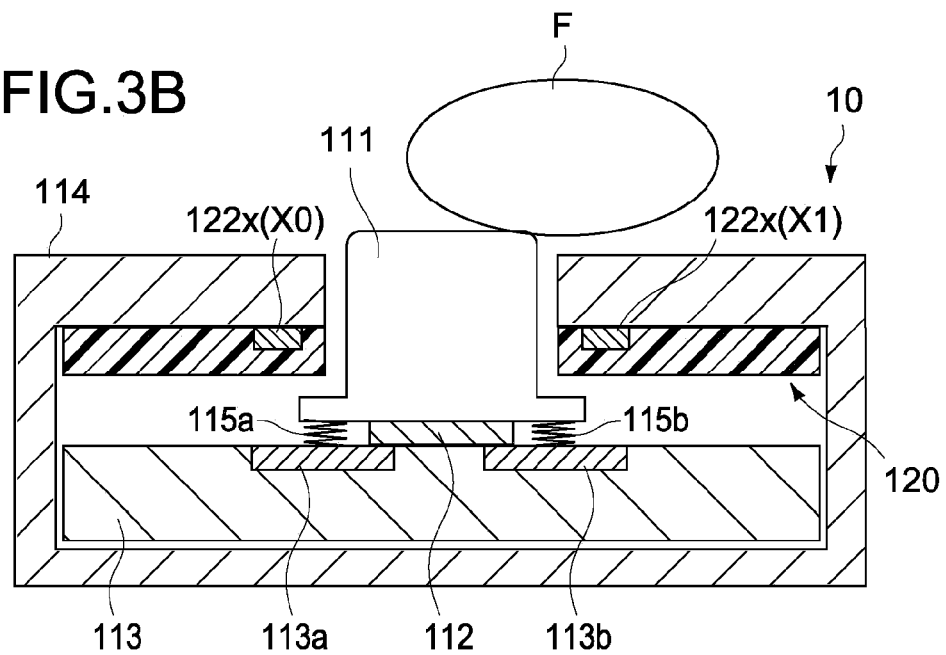

INPUT APPARATUS, INFORMATION PROCESSING APPARATUS, OPERATION INPUT METHOD, AND SENSOR SHEET

CROSS REFERENCES TO RELATED APPLICATIONS

The present disclosure claims priority to Japanese Priority Patent Application JP 2010-127516 filed in the Japan Patent Office on Jun. 3, 2010, the entire content of which is hereby incorporated by reference.

BACKGROUND

The present disclosure relates to an input apparatus, an information processing apparatus, an operation input method, and a sensor sheet, in which an operation member configured to mechanically receive an input operation and a capacitive sensor are combined with each other.

Operation buttons (push buttons) of depression type each have a simple and inexpensive structure and provide a light operational feeling, and thus, have been widely used in the input apparatuses of various electronic apparatuses such as a keyboard of a personal computer, a game controller, a remote controller, and a cellular phone. On the other hand, along with the advancement of the electronic apparatuses in recent years, the input operations necessary for them have been complicated more and more. The push button of the traditional type is, typically, only capable of performing a binary input operation of ON/OFF, and it is limited to a one-dimensional input operation. In view of this, in the related art, in such a manner that the push button is constituted of a cross key, or that other input mechanisms such as a joystick, an analog pad, and a trackball are combined with the push button, a two-dimensional input operation, for example, an operation of moving a pointer on a screen, is allowed.

For example, each of Japanese Patent Application Laid-open No. 2002-229732 and Japanese Patent Application Laid-open No. HEI 9-251350 describes an input apparatus in which a trackball is arranged in the center of the cross key as the traditional-type push button. Japanese Patent Application Laid-open No. 2005-63230 describes an input apparatus capable of moving a cursor on a item-selecting screen by sliding the operation button in back and forth and around. Japanese Patent Application Laid-open No. 2005-44214 describes an electronic apparatus even capable of performing a push-button operation through pushing down an entire mechanism of the trackball. Further, Japanese Patent Application Laid-open No. 2002-131149 describes an input apparatus in which an operation button has an electrostatic-capacitor structure so that a predetermined direction-indicating operation is allowed through pushing the button to an oblique direction.

SUMMARY

However, even with any of the configurations described above, the mechanism becomes significantly complicated in comparison with the traditional type push button. Further, a space for installing the additional mechanism around the button is necessary, or it is necessary to construct the complicated mechanism in a limited space, which can increase probability of a failure. The above-mentioned problem becomes particularly significant in the case where a plurality of operation buttons are arranged to be adjacent to each other. In addition, when the additional mechanism is installed, the operational feeling of the button is deteriorated with a result that the user may not obtain an intended operational feeling.

In view of the above-mentioned circumstances, there is a need for providing an input apparatus, an information processing apparatus, an operation input method, and a sensor sheet, which enable a two-dimensional input operation without making its configuration complicated.

According to an embodiment of the present disclosure, there is provided an input apparatus including an input operation section, a capacitive sensor, and an output section.

The input operation section includes an operation member configured to mechanically receive an input operation, and a first detection circuit configured to detect the input operation of the operation member.

The capacitive sensor includes a plurality of electrodes which are arranged around the operation member, and each of which has a capacitance variable due to an approaching of a detection target, and a second detection circuit configured to detect the capacitance of each of the plurality of electrodes.

The output section is configured to output an output of the first detection circuit and an output of the second detection circuit.

In the above-mentioned input apparatus, each of the electrodes of the capacitive sensor has the capacitance variable due to the approaching of the finger (detection target) of the user operating the operation member. Each of the electrodes is arranged around the operation member, and hence the position and the posture (orientation) on the operation member or the amount of change thereof are detected by the capacitive sensor. With this, not only the operation input by means of the operation member, but also a more expansive operation input based on a two-dimensional motion of the user is allowed. Further, without using a complicated mechanism for the detection of the two-dimensional motion of the user, the detection target can be detected by the use of the capacitance, and hence it is possible to avoid the structure from being complicated, and to detect the input operation with high accuracy utilizing a limited space. In addition, an input operational feeling of the operation member is not deteriorated.

It should be noted that the operation member is not particularly limited as long as it mechanically receives an input operation by the finger of the user or the like.

For example, various operation input device such as an operation lever, a slide switch, a rotating dial, and a joystick.

The capacitive sensor may further include an insulating sheet base material and a connection terminal.

On the sheet base material, the plurality of electrodes are formed. The sheet base material includes a mounting portion to which the operation member is mounted. The connection terminal is attached to the sheet base material, and electrically connects the plurality of electrodes to the second detection circuit.

With this configuration, when the sheet base material is mounted to the input operation section, each of the electrodes can be positioned in place around the operation member with high accuracy. Further, the connection terminal is provided, and hence it is possible to handle the sheet base material and the electrodes independently of the second detection circuit.

The input operation section may further include a support substrate and a casing. The support substrate is configured to support the operation member. The casing is opposed to the support substrate, and has an opening through which the operation member is exposed to an outside of the casing. The sheet base material is installed in an inside of the casing.

With this, it is possible to achieve a simplification of the configuration of the input apparatus.

The first detection circuit may include a first terminal portion and a second terminal portion. The first terminal portion is formed on the support substrate. The second terminal portion is formed on the operation member to be opposed to the first terminal portion, and is brought into contact with the first terminal portion due to the input operation of the operation member.

With this, the input apparatus can be configured without inhibiting an input operational feeling with respect to the operation member.

The operation member may further include a conductive layer formed between the detection target on the operation member and the plurality of electrodes.

With this, it is possible to detect the detection target on the operation member by means of the capacitive sensor with high sensitivity.

The input signal may include a control signal for controlling a motion of an image to be displayed on a display screen of a display apparatus, the control signal being generated based on the output of the second detection circuit.

With this, it is possible to control the motion of the image on the display screen based on a change of a position and a posture of the detection target on the operation member.

The plurality of electrodes may include a first electrode pattern and a second electrode pattern. The first electrode pattern is formed along a first direction. The second electrode pattern is formed along a second direction crossing the first direction.

With this, it is possible to detect the motion of the detection target on the operation member along the first direction and the second direction.

The operation member may include a plurality of operation members arranged on the input operation section, and the plurality of electrodes may be arranged to sandwich each of the plurality of operation members in the first direction and the second direction, respectively.

With this, it is possible to perform a more complex two-dimensional input operation using the plurality of operation members.

According to another embodiment of the present disclosure, there is provided an information processing apparatus including a display section, an input operation section, a capacitive sensor, and a control section.

The display section includes a display screen.

The input operation section includes an operation member configured to mechanically receive an input operation, and a first detection circuit configured to detect the input operation of the operation member.

The capacitive sensor includes a plurality of electrodes which are arranged around the operation member, and each of which has a capacitance variable due to an approaching of a detection target, and a second detection circuit configured to detect the capacitance of each of the plurality of electrodes.

The control section is configured to generate an input signal corresponding to the input operation of the input operation section, based on an output of the first detection circuit and an output of the second detection circuit.

In the above-mentioned information processing apparatus, each of the electrodes of the capacitive sensor has the capacitance variable due to the approaching of the finger (detection target) of the user operating the operation member. Each of the electrodes is arranged around the operation member, and hence the position and the posture (orientation) on the operation member or the amount of change thereof are detected by the capacitive sensor. With this, not only the operation input by means of the operation member, but also a more expansive operation input based on a two-dimensional motion of the user is allowed. Further, without using a complicated mechanism for the detection of the two-dimensional motion of the user, the detection target can be detected by the use of the capacitance, and hence it is possible to avoid the structure from being complicated, and to detect the input operation with high accuracy utilizing a limited space. In addition, an input operational feeling of the operation member is not deteriorated.

According to another embodiment of the present disclosure, there is provided an operation input method including detecting, by a first detection circuit, an input state of an operation member, which is arranged on an input operation section and is configured to mechanically receive an input operation.

A capacitance of each of a plurality of electrodes arranged around the operation member is detected by a second detection circuit.

An input signal corresponding to the input operation of the input operation section is detected based on an output of the first detection circuit and an output of the second detection circuit.

According to the above-mentioned operation input method, not only the operation input by the operation member, but also a more expansive operation input based on a two-dimensional motion of the user is allowed. Further, without using a complicated mechanism for the detection of the two-dimensional motion of the user, the detection target can be detected by the use of the capacitance, and hence it is possible to avoid the structure from being complicated, and to detect the input operation with high accuracy utilizing a limited space. In addition, an input operational feeling of the operation member is not deteriorated.

According to another embodiment of the present disclosure, there is provided a sensor sheet including an insulating sheet base material, a plurality of electrodes, and a connection terminal.

The insulating sheet base material is installed in an input operation section of an input apparatus including an operation member configured to mechanically receive an input operation, and includes a mounting portion to which the operation member can be mounted.

The plurality of electrodes are formed on the sheet base material to surround the mounting portion. Each of the plurality of electrodes has a capacitance variable due to an approaching of a detection target.

The connection terminal is attached to the sheet base material, and electrically connects the plurality of electrodes to a detection circuit configured to detect the capacitance of each of the plurality of electrodes.

According to the above-mentioned sensor sheet, when the sheet base material is mounted to the input operation section, each of the electrodes can be positioned in place around the operation member with high accuracy. Further, the connection terminal is provided, and hence it is possible to handle the sensor sheet independently of the second detection circuit.

According to embodiments of the present disclosure, it is possible to perform a two-dimensional input operation without making its configuration complicated.

Additional features and advantages are described herein, and will be apparent from the following Detailed Description and the figures.

BRIEF DESCRIPTION OF THE FIGURES

FIG. 3 are main-parts sectional views describing an action of the input apparatus;

DETAILED DESCRIPTION

Embodiments of the present application will be described below in detail with reference to the drawings.

First Embodiment

Information Processing Apparatus

Figure 1:
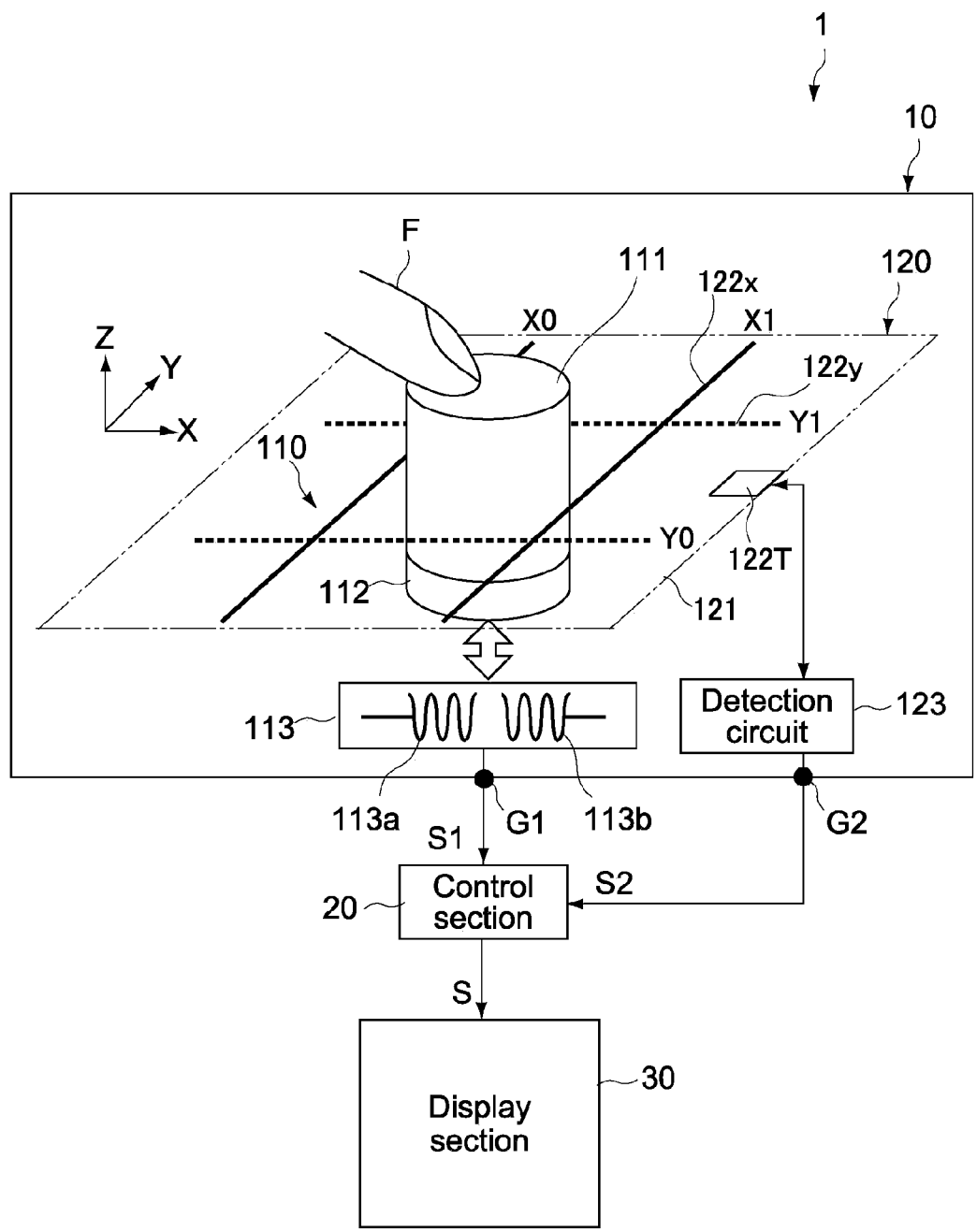
FIG. 1 is a schematic view of a configuration of an information processing apparatus according to an embodiment of the present disclosure.

FIG. 1 is a schematic view of a configuration of an information processing apparatus according to an embodiment of the present disclosure. The information processing apparatus 1 according to this embodiment includes an input apparatus 10, a control section 20, and a display section 30. In this embodiment, a case of applying a game machine as the information processing apparatus 1 will be described.

In the information processing apparatus 1 according to this embodiment, the input apparatus 10 generates an input signal according to an operation by a user (finger) F, and outputs the input signal to the control section 20. The control section 20 generates, according to the input signal, a control signal for controlling an image to be displayed on the display section 30.

Figure 2:
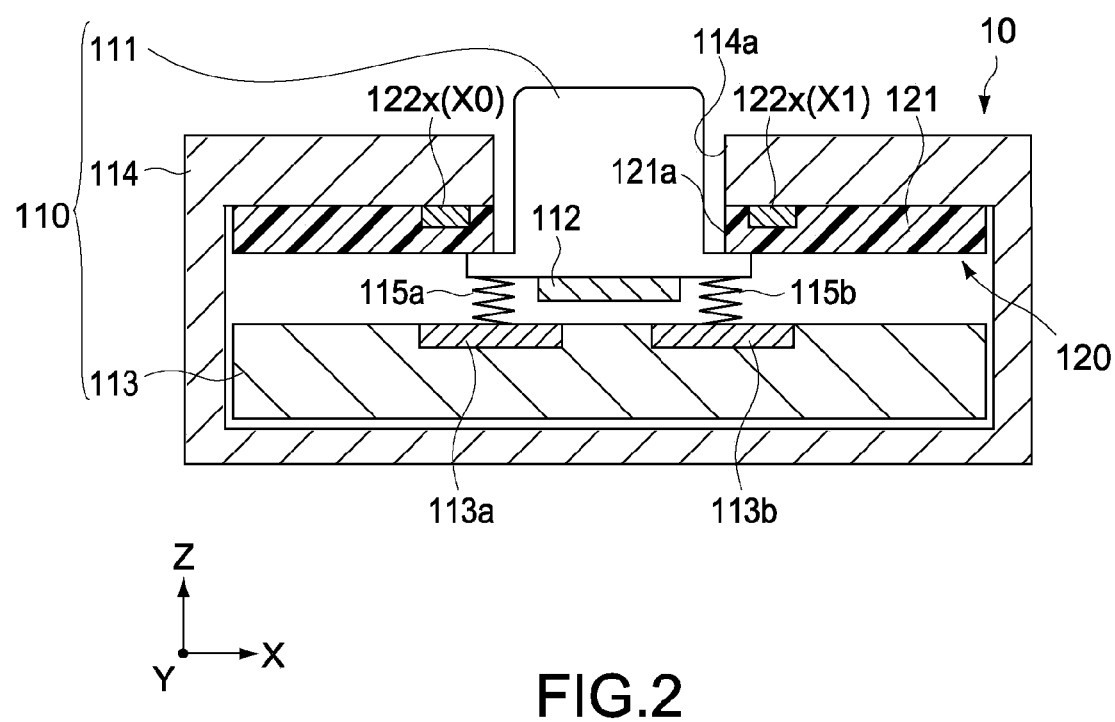
FIG. 2 is a main-parts sectional view of an input apparatus according to the embodiment of the present disclosure.

In the following, the input apparatus 10 will be described in details. FIG. 2 is a main-parts sectional view of the input apparatus 10. In the following, with reference to FIG. 1 and FIG. 2, the description will be made of a basic configuration of the input apparatus 10 of this embodiment. It should be noted that in the drawings, the X-axis direction denotes a lateral direction (right and left direction) of the input apparatus 10, the Y-axis direction denotes a longitudinal direction (back and forth direction) of the input apparatus 10, and the Z-axis direction denotes a perpendicular direction with respect to both of the X-axis direction and the Y-axis direction.

Input Apparatus

The input apparatus 10 of this embodiment corresponds to a controller of the game machine, for example. The input apparatus 10 includes an input operation section 110 and a capacitive sensor 120. The input operation section 110 includes an operation member 111 to be configured to mechanically receive an input operation by the user. The capacitive sensor 120 includes a plurality of wiring electrodes 122$x$ (X0, X1) and 122$y$ (Y0, Y1) arranged around the operation member 111.

Input Operation Section

The input operation section 110 includes the operation member 111, a support substrate 113, and a casing 114. The operation member 111 is constituted of a button switch to be depressed and operated in the Z-axis direction. In FIG. 2, the operation member 111 has a cylindrical shape, and is elastically supported through spring members 115$a$ and 115$b$ on an upper surface of the support substrate 113. The casing 114 houses the operation member 111 and the support substrate 113. The casing 114 has an opening 114$a$ through which the operation member 111 is exposed to the outside. Thus, an input operation with respect to the operation member 111 can be performed from the outside of the casing 114.

The support substrate 113 is constituted of a circuit substrate on which a wiring pattern is formed. The support substrate 113 includes a pair of terminal portions 113$a$ and 113$b$ (first terminal portion), which are separated from each other and opposed to each other. The operation member 111 includes a terminal portion 112 (second terminal portion), which is opposed to the support substrate 113 so that the terminal portion 112 can be brought into contact with both of the terminal portions 113$a$ and 113$b$ simultaneously when the terminal portion 112 is depressed and operated. During a time when the operation member 111 is not operated, the operation member 111 is in a position (non-input position) that the terminal portion 112 is separated from the terminal portions 113$a$ and 113$b$ due to a biasing force of the spring members 115$a$ and 115$b$.

On the other hand, when the operation member 111 is depressed and operated against the biasing force of the spring members 115$a$ and 115$b$, the operation member 111 is in a position (input position) that the terminal portion 112 is in contact with the terminal portions 113$a$ and 113$b$.

The terminal portion 112 and the support substrate 113 (terminal portions 113$a$ and 113$b$) constitute a detection circuit (first detection circuit) configured to detect an input operation with respect to the operation member 111. With the above-mentioned configuration, the input apparatus 10 can be configured without inhibiting an input operational feeling with respect to the operation member 111.

The input apparatus 10 includes an output section G1 (first output section), which is configured to be electrically connected to the support substrate 113. The output section G1 outputs a first output signal S1 corresponding to the non-input position or the input position of the operation member 111 to the control section 20. Typically, the output section G1 outputs a low-level voltage signal (OFF signal) when the operation member 111 is in the non-input position, and outputs a high-level voltage signal (ON signal) when the operation member 111 is in the input position.

The input operation section 110 is not limited to the example in which the input operation section 110 is constituted of the single operation member 111. That is, the input operation section 110 may include operation members of operation types (for example, cross key type, sliding type, rotary type) other than the depression type. Further, a plurality of operation members each having the same configuration as the operation member 111 may be arranged.

Capacitive Sensor

The capacitive sensor 120 is constituted of a sensor sheet. The sensor sheet includes the plurality of wiring electrodes 122x (first electrode pattern) and 122y (second electrode pattern), and sheet base material 121 having electrical insulating properties. The sheet base material 121 supports the plurality of wiring electrodes 122x and 122y. The sheet base material 121 is formed of a plastic sheet of a polyethylene terephthalate (PET), a polyethylene naphthalate (PEN), a polyimide (PI), or a polycarbonate (PC), for example.

The wiring electrodes 122x and 122y are formed in a lattice pattern on the surface of the sheet base material 121. The wiring electrodes 122x of the wiring electrodes 122x and 122y are formed linearly along the Y-axis direction, and arranged in the X-axis direction so as to sandwich the operation member 111 from the right and left sides. The wiring electrodes 122y of the wiring electrodes 122x and 122y extend linearly along the X-axis direction, and arranged in the Y-axis direction so as to sandwich the operation member 111 from the back and forth sides.

It should be noted that the electrode shape of each of the wiring electrodes 122x and 122y is not limited to the linear shape, and the wiring electrodes 122x and 122y can be formed into various shapes as will be described later. Further, the material for the wiring electrodes 122x and 122y is not particularly limited, and various metal materials such as copper, aluminum, and silver can be employed.

The wiring electrodes 122x and 122y are respectively formed on the surfaces of the sheet base material 121. For example, as shown in FIG. 1, the wiring electrodes 122x (X0, X1) are formed on the top surface of the sheet base material 121, and the wiring electrodes 122y (Y0, Y1) are formed on the back surface of the sheet base material 121. Alternatively, for each of the wiring electrodes 122x and 122y, different sheet material is used. The method for forming the wiring electrodes 122x and 122y is not particularly limited. Conductive layers formed on the surfaces of the sheet base material 121 may be subjected to a pattern etching, or the surfaces of the sheet base material 121 may be pattern-plated.

To the sheet base material 121, a connection terminal 122T is attached as shown in FIG. 1. The connection terminal 122T electrically connects each of the wiring electrodes 122x and 122y to the detection circuit 123 to be described later. The connection terminal 122T is formed as a connector terminal electrically connected to each of the wiring electrodes 122x and 122y, and is configured to be detachable to a cable (not shown) connected to the detection circuit 123.

The capacitive sensor 120 is installed in an inside of the casing 114. The sheet base material 121 has a hole 121a (mounting portion) in which the operation member 111 is mounted. Around the hole 121a, the wiring electrodes 122x (X0, X1) and 122y (Y0, Y1) are arranged. The present disclosure is not limited to the illustrated example, and more wiring electrodes may be arranged in the right and left direction (X-axis direction) and the back and forth direction (Y-axis direction) with respect to the hole 121a.

The sheet base material 121 is, as shown in FIG. 2, installed in the inside of the casing 114 in such a state that the operation member 111 is mounted in the hole 121a. As a result, each of the wiring electrodes 122x and 122y on the sheet base material 121 can be positioned around the operation member 111 with high accuracy. Further, it is possible to achieve a simplification of the configuration of the input apparatus 10. For the fixation of the sheet base material 121 with respect to the casing 114, an adhesive or an adhesive tape can be used.

The capacitive sensor 120 includes the detection circuit 123 (second detection circuit) configured to detect a capacitance (or change) of each of the wiring electrodes 122x and 122y (or change). The detection circuit 123 includes a drive section, a computing section, and the like. The drive section oscillates each of the wiring electrodes 122x and 122y. The computing section calculates the capacitance of each of the wiring electrodes 122x and 122y. The detection circuit 123 can be, for example, constituted of an electronic part such as a semi-conductor chip, and is housed in the inside of the casing 114.

The drive section generates a signal voltage to be supplied to each of the wiring electrodes 122x and 122y. The signal voltage is not particularly limited as long as it serves as a signal capable of oscillating the wiring electrodes 122x and 122y. For example, a pulse signal having a predetermined frequency, a high-frequency signal, an alternating-current signal, or a direct-current signal can be used as the signal voltage. The computing section is not particularly limited as long as it serves as a circuit capable of detecting the capacitance of the wiring electrode oscillated or the amount of change thereof. In this embodiment, the computing section converts the capacitance and the amount of change thereof into an integer value (count value).

In this embodiment, the capacitance and the amount of change thereof of each of the wiring electrodes 122x and 122y are detected in a so-called self-capacitance method. The self-capacitance method is also called a single-electrode method, and a single electrode is used for sensing. The electrode for sensing has a stray capacitance with respect to a ground potential, and the stray capacitance of the electrode increases as a grounded detection target such as a human body (finger) approaches it. The computing section detects the above-mentioned increase of the capacitance, to thereby calculate a proximity and a position coordinate of the finger.

In the case where the input operation section 110 has a plurality of operation members 111, the number of the wiring electrodes 122x and 122y to be formed may be determined so that they can be arranged around a part or all of the plurality of operation members 111.

An oscillating method, that is, a scan method for the wiring electrodes 122x and 122y is not particularly limited. For example, an oscillating method of simultaneously oscillating the wiring electrodes 122x and 122y at each row may be employed, or an oscillating method of sequentially oscillating the wiring electrodes 122x and 122y at each row may be employed.

The input apparatus 10 includes an output section G2 (second output section) configured to be electrically connected to the detection circuit 123. The output section G2 outputs a second output signal S2 corresponding to the capacitance value of each of the wiring electrodes 122x and 122y to the control section 20.

Control Section

The control section 20 generates an input signal S corresponding to an input operation with respect to the input operation section 110 according to the first output signal S1 output from the support substrate 113 (output section G1) and the second output signal S2 output from the detection circuit 123 (output section G2). In this embodiment, the input signal S corresponds to the control signal for controlling a motion of the image to be displayed on the display screen of the display section 30.

The control section 20 is, typically, constituted of a computer. Although the control section 20 can be also constituted of a part of the input apparatus 10, the control section 20 is stored in a control apparatus physically separated from the input apparatus 10 in this embodiment. The control apparatus corresponds to a main body of the game machine or the like. A communication between the input apparatus 10 and the control section 20 may be a wired communication or a wireless communication. The communication method is not particularly limited. On the other hand, the control section 20 may be integral to the display section 30. In this case, the control section 20 and the display section 30 are applied to a general-purpose television or the like.

Operation of Information Processing Apparatus

Next, with reference to an example of an operation of the information processing apparatus 1 according to this embodiment, an operation input method using the input apparatus 10 will be described.

The operation input method of this embodiment includes a step of detecting an input state of the operation member 111. The input state of the operation member 111 is detected on the basis of a contact/non-contact between the terminal portion 112 of the operation member 111 and the terminal portions 113*a* and 113*b* of the support substrate 113. The input apparatus 10 generates the first output signal S1 including information about the input state of the operation member 111, and outputs the first output signal S1 from the first output section G1 to the control section 20.

The operation input method of this embodiment further includes a step of detecting the capacitance of each of the wiring electrodes 112*x* and 112*y* arranged around the operation member 111. The wiring electrodes 112*x* and 112*y* each have the capacitance that changes due to the approaching of the finger F being a detection target. The detection circuit 123 detects the capacitance of each of the wiring electrodes 122*x* and 122*y*, to thereby detect the position of the finger F on the operation member 111, a change of the posture thereof, and the like. The input apparatus 10 generates the second output signal S2 including information about the position of the finger F and the like, and outputs the second output signal S2 from the second output section G2 to the control section 20.

The operation input method of this embodiment further includes a step of generating the input signal corresponding to the input operation with respect to the input operation section 110 according to the first output signal S1 and the second output signal S2. The input signal is generated in the control section 20. The control section 20 generates the control signal S for controlling the motion of the image to be displayed on the display screen of the display section 30, as the input signal.

In this embodiment, according to the first output signal S1 from the input apparatus 10, the control section 20 generates the control signal for executing functions (for example, execution and selection of command) that are set in advance correspondingly to the output signal S1, and controls the image to be displayed on the display section 30.

Further, according to the second output signal S2, the control section 20 detects the position and the posture (orientation) of the finger F on the operation member 111 or the amount of change thereof, and adds, to the control signal, direction-indicating information with respect to the back and forth direction (Y-axis direction) and the right and left direction (X-axis direction), the operation member 111 being as a reference.

For example, as shown in FIGS. 3A and 3B, the case where the finger F depressing the operation member 111 is offset to the right side (+X direction) in the drawing will be considered. In this case, of the wiring electrodes X0 and X1 sandwiching the operation member 111 in the X-axis direction, a capacitive coupling between the finger F and the wiring electrode X1 positioned on the right side is stronger than a capacitive coupling between the finger F and the wiring electrode X0 positioned on the left side, and hence the capacitance of the wiring electrode X1 is larger than the capacitance of the wiring electrode X0. Thus, on the basis of the capacitance of each of the wiring electrodes X0 and X1, the control section 20 can determine that the finger F is positioned on the right side.

When it is detected according to the first output signal S1 that a depression operation of the operation member 111 is performed under the above-mentioned state, the control section 20 generates the control signal that is set in advance correspondingly to a combination of the information of the output signals S1 and S2.

For example, in a football game in the past, in the case where a cross key is used for both of a direction-indicating operation for a character and a direction-indicating operation for kicking, it was difficult to perform an input operation of "the character kicks a ball to a certain direction while the character is running in a different direction." According to this embodiment, the operation member 111 of the input apparatus 10 can be assigned to a shoot button, and hence when the operation member 111 is depressed while the user intentionally shifts or inclines the finger F on the operation member 111 to a direction of kicking a ball, the above-mentioned operation can be easily achieved.

On the other hand, the control section 20 is capable of detecting a displacement of the finger F under a state in which the operation member 111 is depressed. In this case, the control section 20 is capable of changing the generated control signal correspondingly to the displacement of the finger F.

For example, in a first person shooting game (FPS game) in the past, in the case where a cross key is used for both of a direction-indicating operation for a character and a focus-moving operation for a continuous shooting operation, it was difficult to perform an operation of "the user moves both of the focus and the character while performing the continuous shooting operation." According to this embodiment, the operation member 111 of the input apparatus 10 can be assigned to a continuous shooting button, and hence when the user intentionally shifts or inclines the finger F on the operation member 111 while depressing the operation member 111 so as to move the focus, and at the same time, the character can be moved by means of the cross key. With this, and hence the above-mentioned operation can be easily achieved.

In addition, according to the second output signal S2, the control section 20 is capable of detecting the position of the finger F, the proximity distance, and the like by the use of the capacitance, and hence the control section 20 is capable of generating the control signal by the use of the second output signal S2 irrespective of a presence or absence of the input operation with respect to the operation member 111.

For example, in the FPS game in the past, in the case where an direction-indicating operation of a character and an operation of zooming a field of view are respectively assigned to different buttons, an operation of "the user changes the viewing direction while zooming the field of view" was not intuitive and this operation needed proficiency. According to this embodiment, when the operation member ill of the input apparatus 10 is assigned to a view change button, the above-mentioned operations can be easily realized. That is, according to this embodiment, the user can move a view by shifting or inclining the finger F to a predetermined horizontal direction with respect to a center position of the operation member 111, increase the size of the field of view by increasing an amount of depression of the operation member 111, and decrease the size of the field of view by decreasing the amount of depression of the operation member 111.

As described above, according to this embodiment, not only the operation input by means of the operation member 111, but also a more expansive operation input based on a two-dimensional operation by the user can be realized. In particular, it is possible to control the motion of the image on the display screen and to change a control content (operation effect) according to the change of the position and the posture of the finger F on the operation member 111.

Further, in this embodiment, the detection target can be detected by the use of the capacitance without using a complicated mechanism for the detection of the two-dimensional operation by the user. With this, it is possible to detect the input operation with high accuracy, utilizing a limited space, without the need of a complicated structure for the detection of the two-dimensional operation by the user. In addition, an input operational feeling of the operation member is not deteriorated.

In addition, in this embodiment, the sheet base material 121 supporting the wiring electrodes 122x and 122y is constituted of a member different from that of the input operation section 110. Therefore, when the sheet base material 121 is mounted to the input operation section 110, each of the wiring electrodes 122x and 122y can be positioned in place around the operation member 111 with high accuracy. Further, the sheet base material 121 is provided with the connection terminal 122T, and hence it is possible to handle the sheet base material 121 and the wiring electrodes 122x and 122y independently of the detection circuit 123.

Second Embodiment

Figure 4:
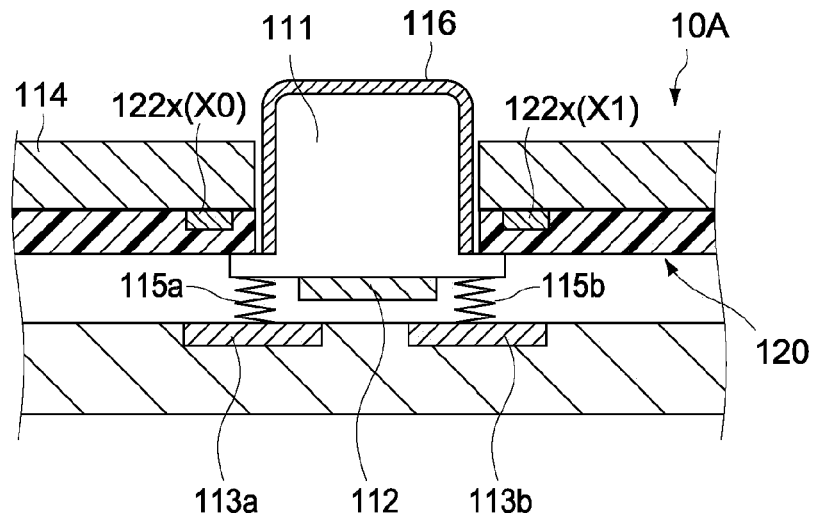
FIG. 4 is a main-parts sectional view of an input apparatus according to another embodiment of the present disclosure.

FIG. 4 is a main-parts sectional view of an input apparatus according to a second embodiment of the present disclosure. The input apparatus 10A of this embodiment is applied as the input apparatus in the information processing apparatus described above in the first embodiment. It should be noted that in the following, the parts similar to those of the above-mentioned first embodiment are denoted by the same symbols and that the detailed description thereof is omitted.

In the input apparatus 10A of this embodiment, the operation member 111 includes a conductor layer 116. The conductor layer 116 is formed on the operation member 111 so as to position between the detection target (finger F) on the operation member 111 and the wiring electrodes 122x and 122y arranged around the operation member 111. With this, when an input operation with respect to the operation member 111 is performed, the conductor layer 116 can be considered as the finger, and hence it is possible to increase a detection sensitivity of the finger F by the wiring electrodes 122x and 122y. In particular, as in this embodiment, in the case where the wiring electrodes 122x and 122y are arranged on an inner surface side of the casing 114 and it may be impossible to sufficiently ensure the sensitivity due to effects of diffusion of the electrical field due to the material for the casing 114 and the like, a significant effect can be exerted.

Although in this embodiment, the conductor layer 116 is formed on the top surface of the operation member 111, the present disclosure is not limited thereto. The conductor layer 116 may be formed on a side surface of the operation member 111 or in an inside of the operation member 111. Although the conductor layer 116 is formed through applying a film of a conductive material, the present disclosure is not limited thereto. The conductor layer 116 may be formed of a metal film, a thin film, or the like.

The inventors measured a difference of the detection sensitivity between the wiring electrodes 122x and 122y due to the presence or absence of the conductor layer 116, using an input apparatus C1 and an input apparatus C2. In the input apparatus C1, the conductor layer 116 is formed on the top surface of the operation member 111. The input apparatus C2 has the same configuration as that of the input apparatus C1 except for the fact that the conductor layer 116 is not formed. In the experiment, a plunger made of a metal is held at a directly upper position with respect to the center portion of the top surface of the operation member 111. The conductor layer 116 is formed through applying a conductive coating material for correcting a hot wire, which is available in the market, to the entire region of the operation member 111. A distance between the top surface of the operation member 111 and the plunger was set to 1 mm. As a result of the experiment, it was confirmed that in comparison with the input apparatus C2, the detection sensitivity of the input apparatus C1 increased from 1.3 to 1.5 times.

Third Embodiment

Figure 5:
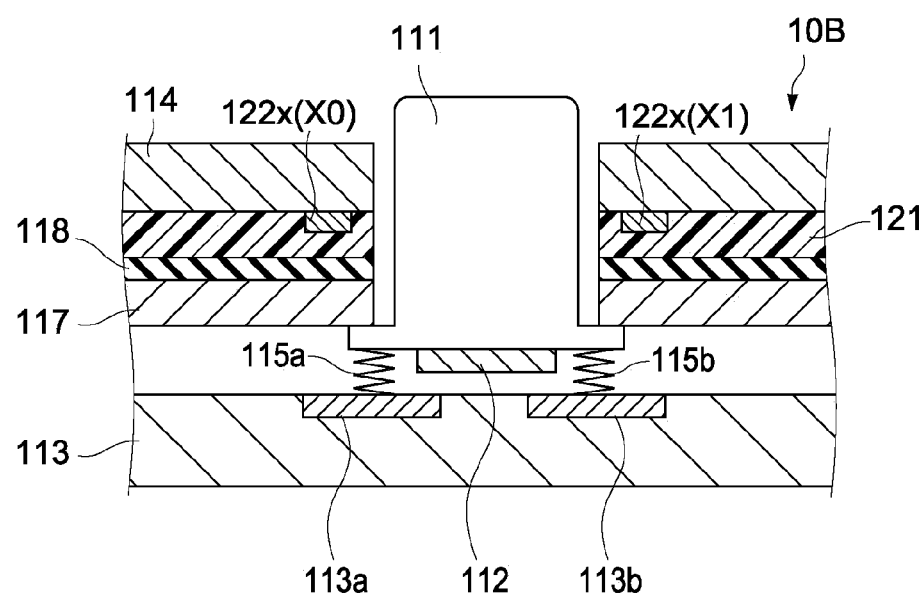
FIG. 5 is a main-parts sectional view of an input apparatus according to still another embodiment of the present disclosure.

FIG. 5 is a main-parts sectional view of an input apparatus according to a third embodiment of the present disclosure. The input apparatus 10B of this embodiment is applied as the input apparatus in the information processing apparatus described above in the first embodiment. It should be noted that in the following, the parts similar to those of the above-mentioned first embodiment are denoted by the same symbols and that the detailed description thereof is omitted.

In general, in view of the structure of an electronic apparatus, metal parts have to be arranged in the vicinity of the electrodes of the capacitive sensor. The metal parts include, for example, a metal chassis for enhancing a mechanical strength of the casing, an electrical shield for blocking a radiant radio wave, and a battery pack. When the metal parts exist in the vicinity of the electrodes of the capacitive sensor, the electrical field radiated from the electrodes is attracted to the metal parts, and hence the detection sensitivity of the target is decreased, and particularly, the detection sensitivity at a great distance is significantly decreased.

The input apparatus 10B of this embodiment includes, for example, as shown in FIG. 5, a metal plate 117 and an insulating sheet 118. The metal plate 117 is arranged between the support substrate 113 and the sheet base material 121 and serves as a shield against the electrical field. The insulating sheet 118 is arranged between the metal plate 117 and the sheet base material 121. The insulating sheet 118 is formed of an electrical insulating material having relatively low electric permittivity, and has a function of preventing a decrease of the detection sensitivity of the wiring electrodes 122x and 122y due to the metal plate 117. With this, it is possible to suppress a decrease of the detection sensitivity of the capacitance of each of the wiring electrodes 122x and 122y, and to sufficiently ensure the sensitivity necessary for the detection of the finger operating the operation member 111.

Fourth Embodiment

Figure 6:
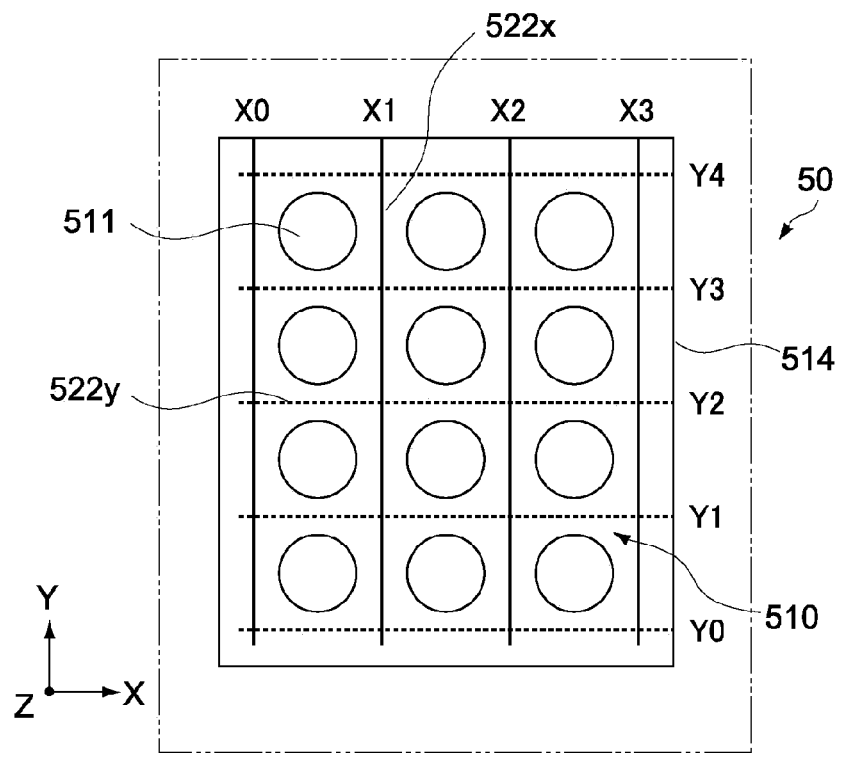
FIG. 6 is a schematic plan view of an input apparatus according to still another embodiment of the present disclosure.

FIG. 6 is a schematic plan view of an input apparatus according to a fourth embodiment of the present disclosure. The input apparatus 50 of this embodiment is configured, for example, as a remote controller to be used in the electronic apparatus such as a television or a video player, or as a keyboard of a cellular phone or the like.

The input apparatus 50 includes an input operation section 510 and a plurality of wiring electrodes 522x (X0 to X3) and 522y (Y0 to Y4). In the input operation section 510, a plurality of operation members (buttons) 511 of depression type are arranged in a matrix manner in the XY plane. The plurality of wiring electrodes 522x (X0 to X3) and 522y (Y0 to Y4) are arranged in the X-axis direction and the Y-axis direction in a lattice pattern. The input operation section 510 includes a casing 514 configured to house the operation members 511 and a support substrate (first detection circuit) (not shown) configured to support the operation members 511. The support substrate is housed in an inside of the casing 514. The wiring electrodes 522x and 522y are formed on a sheet base material (not shown) and are housed in the inside of the casing 514. The sheet base material has a hole (mounting portion) in which each of the operation members 511 can be mounted similarly to the above-mentioned first embodiment, and is fixed in the inside of the casing 514. In addition, in the inside of the casing 514, a detection circuit (second detection circuit) is housed. The detection circuit detects the capacitance of each of the wiring electrodes 522x and 522y. The detection circuit, the sheet base material, and the wiring electrodes 522x and 522y constitute a capacitive sensor.

Further, similarly to the above-mentioned first embodiment, the input apparatus 50 includes an output section configured to output, to a control section (not shown), an output signal (first output signal) corresponding to an input operation of the operation members 511 and an output signal (second output signal) including information about the capacitance of each of the wiring electrodes 522x and 522y.

According to the input apparatus 50 of this embodiment, the same action and effect as those in the above-mentioned first embodiment can be obtained. In particular, it is possible to control a movement of a pointer (cursor) on the screen by moving a finger directly on the input operation section 510 in a case of a free cursor screen or the like. Further, one of the operation members 511, that the finger of the user will operate, can be detected by the use of the capacitance, and hence it is possible to predictably display input operation information (for example, selected channel number) corresponding to the above-mentioned operation member before the input operation is executed with respect to the operation member.

The electrode shape of each of the wiring electrodes 522x and 522y constituting the capacitive sensor is not limited to the example shown in FIG. 6. In order to further enhance the detection sensitivity, any of the electrode shapes as shown in FIG. 7 to FIG. 11 may be employed. It should be noted that those electrode shapes are also applicable to the wiring electrodes in the first embodiment.

Figure 7:
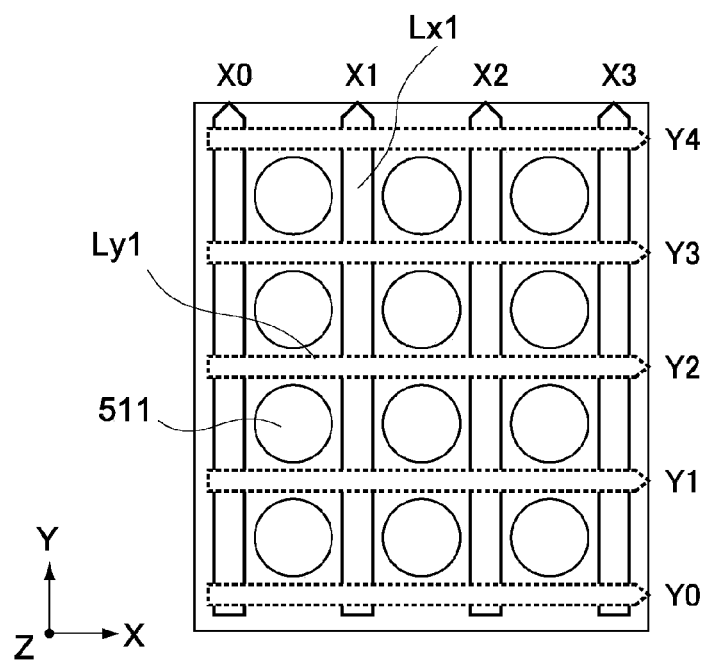
FIG. 7 is a schematic plan view describing a modification of the input apparatus of FIG. 6.

FIG. 7 shows an example in which the electrode width of each of the wiring electrodes Lx1 and Ly1 at each row is set to be larger than the electrode width of each of the wiring electrodes 522x and 522y shown in FIG. 6. As shown in the drawing, when the electrode width is set to be larger, the electrode area becomes larger. Thus, it is possible to achieve an enhancement of the detection sensitivity.

Figure 8:
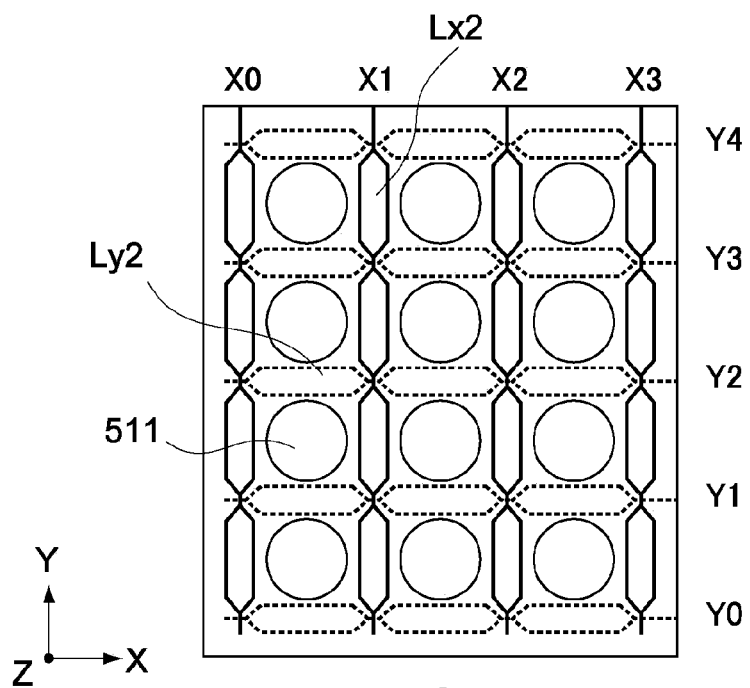
FIG. 8 is a schematic plan view describing a modification of the input apparatus of FIG. 6.

FIG. 8 shows an example in which the electrode width of each of the wiring electrodes Lx2 and Ly2 at each row is set to be smaller at each cross portion of the wiring electrodes Lx2 and Ly2 at each row and to be larger at each non-cross portion of the wiring electrodes Lx2 and Ly2 at each row. With this, the capacitance at each cross portion of the wiring electrodes Lx2 and Ly2 can be minimized, which becomes significantly effective in the case of employing the self-capacitance method as the detection method.

Figure 9:
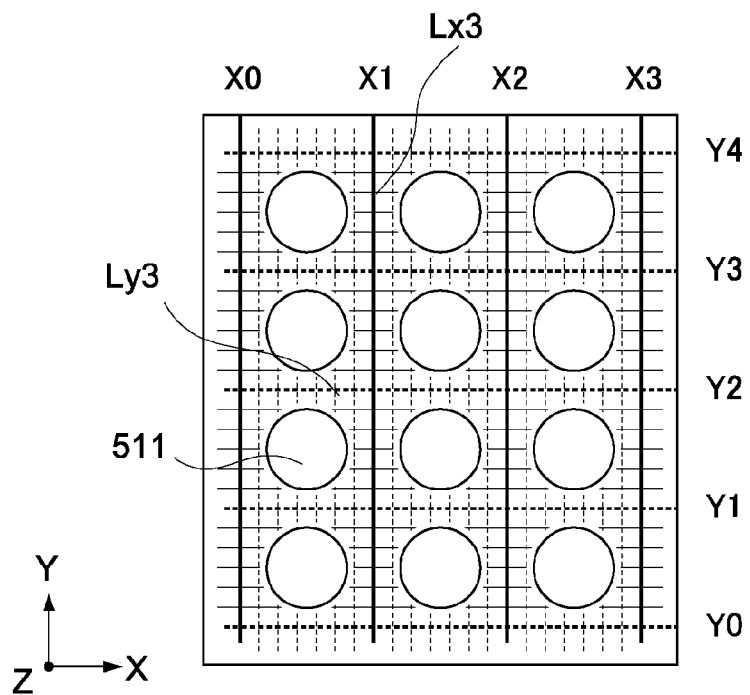
FIG. 9 is a schematic plan view describing a modification of the input apparatus of FIG. 6.

FIG. 9 shows an example in which while the electrode width of each of the wiring electrodes Lx3 and Ly3 at each row is set to be basically equal to the electrode width of each of the electrodes shown in FIG. 6, the electrode width is to be expanded to a direction crossing a longitudinal direction of each wiring in an intermittent manner. With this, a coordinate detection accuracy when the finger F is positioned in the vicinity of the wiring electrodes Lx3 and Ly3 can be enhanced. That is, with the electrode shape of each of the wiring electrodes Lx3 and Ly3 shown in FIG. 9, each of the wiring electrodes has a broader sensing area, and hence it is possible to relatively stably obtain a detection coordinate of the finger F even in a region between the wiring electrodes, for example, a directly upper region with respect to the operation member (button) 511.

Figure 10:
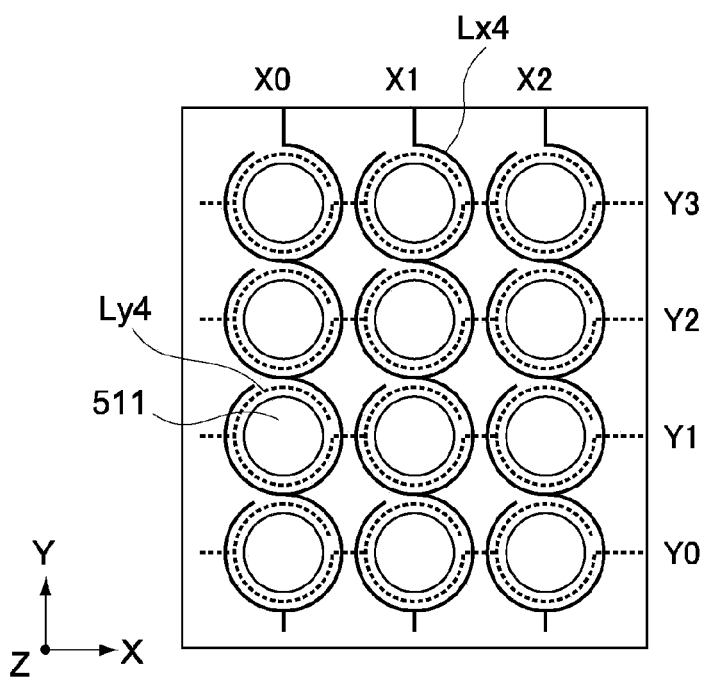
FIG. 10 is a schematic plan view describing a modification of the input apparatus of FIG. 6.
Figure 11:
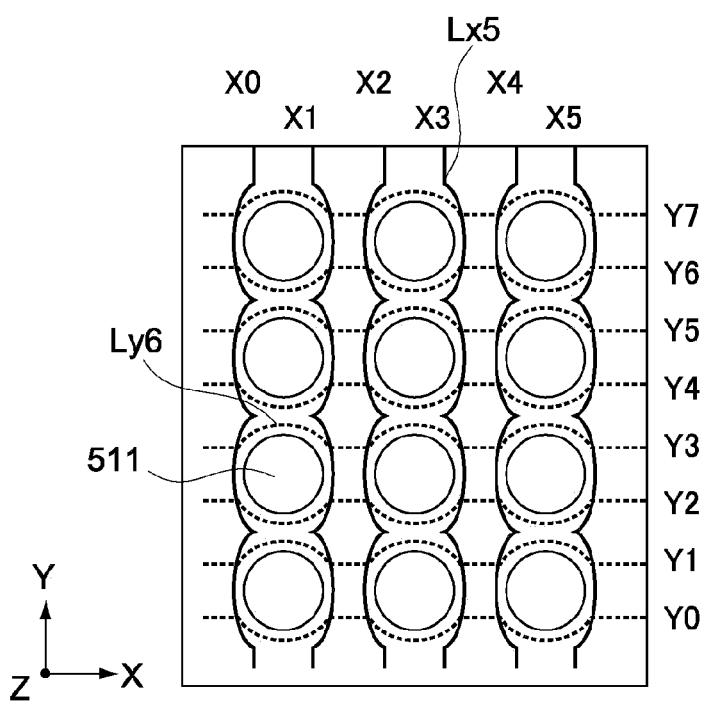
FIG. 11 is a schematic plan view describing a modification of the input apparatus of FIG. 6.

FIG. 10 shows an example in which each of the wiring electrodes Lx4 and Ly4 at each row is formed so as to have substantially circle portions respectively surrounding the operation members 511. Further, FIG. 11 shows an example in which each of the wiring electrodes Lx5 and Ly5 at each row is formed so as to have circular-arc portions respectively surrounding the operation members 511. The above-mentioned wiring electrodes are formed by continuously connecting electrode patterns each having a substantially circle shape or a circular-arc shape in the X-axis direction and the Y-axis direction. With this, it is possible to enhance the detection sensitivity of the finger on each of the operation members 511.

Although the embodiments of the present disclosure have been described, the present disclosure is not limited thereto, and various modification can be made on the basis of the technical concept of the present disclosure.

Although, for example, in each of the above embodiments, the capacitive sensor utilizing the detection discipline of the self-capacitance method has been exemplified. In place of this, the present disclosure is also applicable to a capacitive sensor utilizing a so-called mutual capacitance method for detecting the capacitance at each cross portion of the wiring electrodes in the X-axis direction and the Y-axis direction, as its detection discipline.

Further, although in each of the above embodiments, the operation button of depression type has been exemplified as the operation member 111, in place of this, the present disclosure is also applicable to an operation lever such as a slide switch, a rotating dial, or a joystick.

Figure 12:
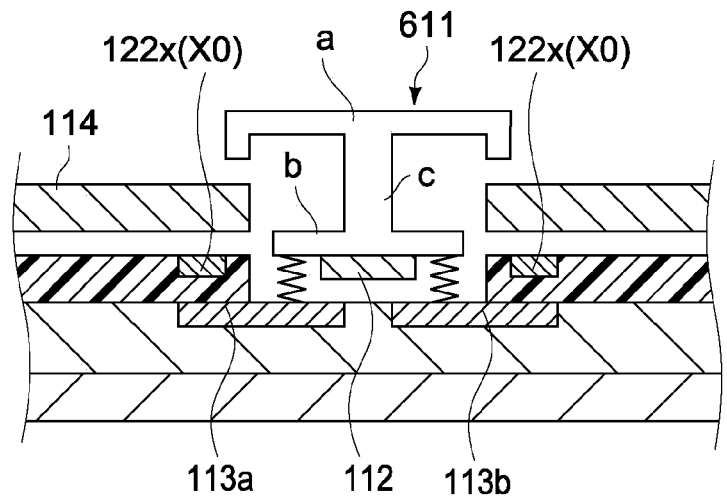
FIG. 12 is a schematic sectional view describing a modification of the input apparatus of FIG. 2.

Further, although in each of the above embodiments, the operation member 111 having a cylindrical shape has been exemplified, the shape of the operation member is not limited to the above-mentioned example. For example, an operation member 611 having the shape shown in each of FIG. 12 to FIG. 14 may be used. It should be noted that in FIG. 12 to FIG. 14, the parts similar to those of the above-mentioned first embodiment are denoted by the same symbols and that the detailed description thereof is omitted.

Figure 13:
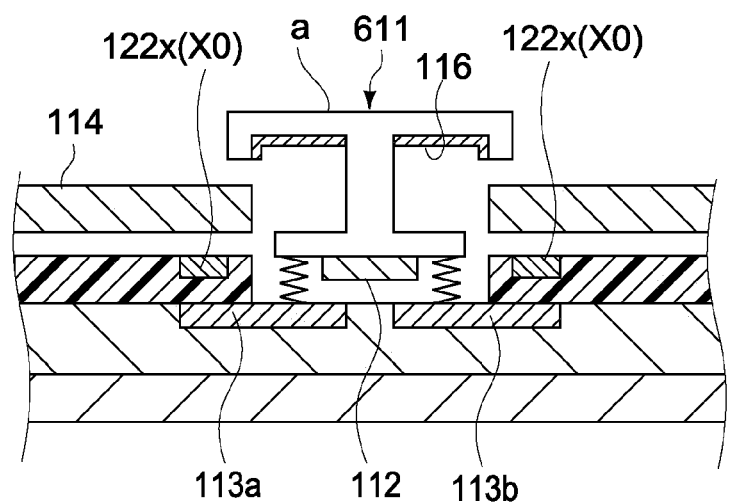
FIG. 13 is a schematic sectional view describing a modification of the input apparatus of FIG. 4.
Figure 14:
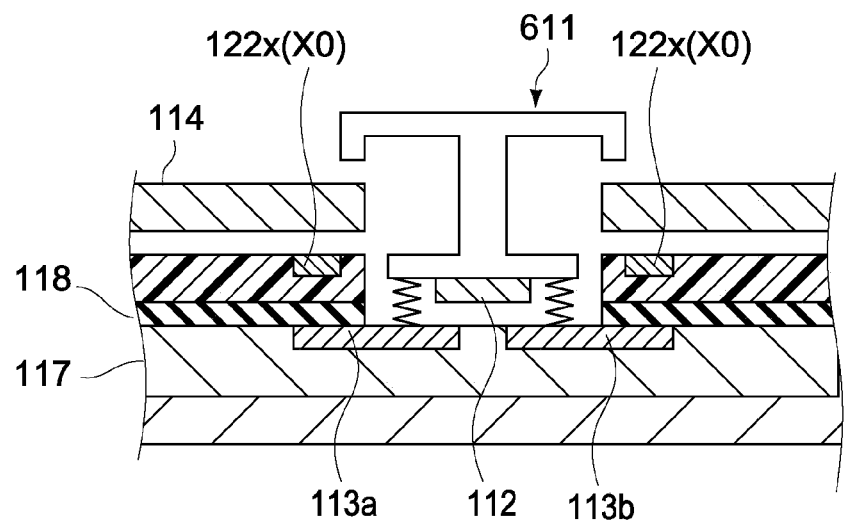
FIG. 14 is a schematic sectional view describing a modification of the input apparatus of FIG. 5.

That is, the illustrated operation member 611 includes a first disk portion "a" having a larger diameter, which serves as an operation surface, a second disk portion "b" having a smaller diameter, which includes the terminal portion 112, and a shaft portion "c" connecting the first disk portion and the second disk portion to each other. FIG. 13 shows an example, which corresponds to a modification of the second embodiment, in which the conductor layer 116 is formed on the back surface side of the first disk portion "a" in order to enhance the detection sensitivity of each of the wiring electrodes 122x and 122y. The conductor layer 116 is not limited to the conductor layer 116 formed only on the back surface side of the disk portion "a," and the conductor layer 116 may be formed on all surfaces of the disk portion "a." In addition, FIG. 14 shows an example, which corresponds to a modification of the third embodiment, in which the metal plate 117 for shielding the electrical field and the insulating sheet 118 for preventing a decrease of the detection sensitivity due to the metal plate 117 are arranged in the inside of the casing 114. Even with the above-mentioned configurations, the same action and effect as those in each of the first embodiment to the third embodiment described above can be obtained.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:

1. An input apparatus, comprising:
   an input operation section including an operation member configured to mechanically receive an input operation, and a first detection circuit configured to detect the input operation of the operation member;
   a capacitive sensor including a plurality of electrodes formed on an insulating sheet base material which are arranged around the operation member, and each of which has a capacitance variable due to an approaching of a detection target, and a second detection circuit configured to detect the capacitance of each of the plurality of electrodes;
   a casing configured to house the operation member, the capacitive sensor, and a support substrate by surrounding both the capacitive sensor and the support substrate configured to support the operation member, the casing including an opening through which the operation member is exposed to an outside of the casing;
   an insulating sheet and a metal plate formed between the insulating sheet base material and the support substrate; and
   an output section configured to output an output of the first detection circuit and an output of the second detection circuit.

2. The input apparatus according to claim 1, wherein the insulating sheet base material includes a mounting portion to which the operation member is mounted, and
   a connection terminal, which is attached to the sheet base material, and electrically connects the plurality of electrodes to the second detection circuit.

3. The input apparatus according to claim 2, wherein the sheet base material is installed in an inside of the casing.

4. The input apparatus according to claim 3, wherein the first detection circuit includes,
   a first terminal portion formed on the support substrate, and
   a second terminal portion, which is formed on the operation member to be opposed to the first terminal portion, and is brought into contact with the first terminal portion due to the input operation of the operation member.

5. The input apparatus according to claim 1, wherein the operation member further includes a conductive layer formed between the detection target on the operation member and the plurality of electrodes.

6. The input apparatus according to claim 1, wherein the plurality of electrodes include,
   a first electrode pattern formed along a first direction, and
   a second electrode pattern formed along a second direction crossing the first direction.

7. The input apparatus according to claim 6, wherein the operation member includes a plurality of operation members arranged on the input operation section, and
   the plurality of electrodes are arranged to sandwich each of the plurality of operation members in the first direction and the second direction, respectively.

8. The input apparatus according to claim 1, further comprising:
   a control section configured to generate an input signal corresponding to the input operation of the input operation section, based on the output of the first detection circuit and the output of the second detection circuit.

9. The input apparatus according to claim 8, wherein the input signal includes a control signal for controlling a motion of an image to be displayed on a display screen of a display apparatus, the control signal being generated based on the output of the second detection circuit.

10. An information processing apparatus, comprising:
    an input operation section including an operation member configured to mechanically receive an input operation, and
    a first detection circuit configured to detect the input operation of the operation member;
    a capacitive sensor including a plurality of electrodes formed on an insulating sheet base material which are arranged around the operation member, and each of which has a capacitance variable due to an approaching of a detection target, and
    a second detection circuit configured to detect the capacitance of each of the plurality of electrodes;
    a casing configured to house the operation member, the capacitive sensor, and a support substrate by surrounding both the capacitive sensor and the support substrate configured to support the operation member, the casing including an opening through which the operation member is exposed to an outside of the casing;
    an insulating sheet and a metal plate formed between the insulating sheet base material and the support substrate; and
    a control section configured to generate an input signal corresponding to the input operation of the input operation section, based on an output of the first detection circuit and an output of the second detection circuit.

11. An operation input method in an information processing apparatus having an input operation section that includes an operation member, comprising:
    detecting, by a first detection circuit, an input state of the operation member, which is arranged on the input operation section and is configured to mechanically receive an input operation;
    detecting, by a second detection circuit, a capacitance of each of a plurality of electrodes formed on an insulating sheet base material arranged around the operation member; and
    generating an input signal corresponding to the input operation of the input operation section based on an output of the first detection circuit and an output of the second detection circuit, wherein the input operation section includes a casing configured to house the operation member, the capacitive sensor, and a support substrate by surrounding both the capacitive sensor and the support substrate configured to support the operation member, the casing including an opening through which the operation member is exposed to an outside of the casing, wherein the input operation section has an insulating sheet and a metal plate formed between the insulating sheet base material and the support substrate.

12. A sensor sheet, comprising:
    an insulating sheet base material which is installed in an input operation section of an input apparatus including an operation member configured to mechanically receive an input operation, and includes a mounting portion to which the operation member can be mounted;
    a plurality of electrodes, which are formed on the sheet base material to surround the mounting portion, and each of which has a capacitance variable due to an approaching of a detection target; and a connection terminal, which is attached to the sheet base material, and electrically connects the plurality of electrodes to a detection circuit configured to detect the capacitance of each of the plurality of electrodes, wherein the input operation section further includes a casing configured to house the operation member, the capacitive sensor, and a support substrate by surrounding both the capacitive sensor and the support substrate configured to support the operation member, the casing including an opening through which the operation member is exposed to an outside of the casing, wherein an insulating sheet and a metal plate are formed between the insulating sheet base material and the support substrate.

* * * * *